(12) United States Patent
Ikenoue et al.

(10) Patent No.: US 8,802,187 B2
(45) Date of Patent: Aug. 12, 2014

(54) SOLAR CELL AND PROCESS FOR PRODUCING THE SAME

(75) Inventors: Yoshiaki Ikenoue, Yokohama (JP); Hisayuki Miki, Chiba (JP); Kenzo Hanawa, Ichihara (JP); Yasumasa Sasaki, Kamakura (JP); Hitoshi Yokouchi, Ichihara (JP); Ryoko Konta, Chiba (JP); Hiroaki Kaji, Chiba (JP)

(73) Assignee: Showa Denko K.K., Tokyo (JP)

( * ) Notice: Subject to any disclaimer, the term of this patent is extended or adjusted under 35 U.S.C. 154(b) by 1054 days.

(21) Appl. No.: 12/820,892

(22) Filed: Jun. 22, 2010

(65) Prior Publication Data

US 2010/0261308 A1   Oct. 14, 2010

Related U.S. Application Data

(62) Division of application No. 12/033,603, filed on Feb. 19, 2008, now abandoned.

(60) Provisional application No. 60/905,820, filed on Mar. 9, 2007.

(30) Foreign Application Priority Data

Feb. 19, 2007   (JP) .................................. 2007-038161

(51) Int. Cl.
*H01L 21/203* (2006.01)
*H01L 51/00* (2006.01)

(52) U.S. Cl.
CPC .................................. *H01L 51/0008* (2013.01)
USPC ................ 427/74; 438/85; 136/258; 136/262

(58) Field of Classification Search
CPC ............................................... H01L 31/022425
USPC ............................... 136/243–268; 438/57–98
See application file for complete search history.

(56) References Cited

U.S. PATENT DOCUMENTS

| 5,091,018 A | 2/1992 | Fraas et al. |
| 6,475,923 B1 | 11/2002 | Mitamura |
| 6,669,830 B1 | 12/2003 | Inoue et al. |

(Continued)

FOREIGN PATENT DOCUMENTS

| JP | 60-039819 A | 3/1985 |
| JP | 3-218622 A | 9/1991 |

(Continued)

OTHER PUBLICATIONS

Elkashef et al., Sputter Deposition of Gallium Nitride Films Using a GaAs Target, Thin Solid Films 333, pp. 9-12 (1998).*

(Continued)

*Primary Examiner* — Jayne Mershon
(74) *Attorney, Agent, or Firm* — Sughrue Mion, PLLC (57) ABSTRACT

The present invention provides a method of manufacturing a solar cell, comprising forming a buffer layer comprising a group-III nitride semiconductor on a substrate using a sputtering method, and forming a group-III nitride semiconductor layer and electrodes on the buffer layer. The group-III nitride semiconductor layer is formed on the buffer layer by at least one selected from the group consisting of the sputtering method, a MOCVD method, an MBE method, a CBE method, and an MLE method, and the electrodes are formed on the group-III nitride semiconductor layer.

4 Claims, 2 Drawing Sheets

(56) References Cited

U.S. PATENT DOCUMENTS

| | | |
|---|---|---|
| 6,830,949 B2 | 12/2004 | Senda et al. |
| 2004/0118451 A1 | 6/2004 | Walukiewicz et al. |
| 2005/0056863 A1* | 3/2005 | Negami et al. ............. 257/184 |
| 2005/0211291 A1* | 9/2005 | Bianchi ..................... 136/255 |
| 2007/0151509 A1* | 7/2007 | Park et al. .................. 117/200 |
| 2008/0230800 A1* | 9/2008 | Bandoh et al. ............. 257/103 |
| 2009/0179220 A1 | 7/2009 | Fukunaga et al. |

FOREIGN PATENT DOCUMENTS

| | | | |
|---|---|---|---|
| JP | 07-288334 A | | 10/1995 |
| JP | 8-306635 A | | 11/1996 |
| JP | H08-306635 | * | 11/1996 |
| JP | 2001-004445 A | | 1/2001 |
| JP | 2001-35805 A | | 2/2001 |
| JP | 2001-308010 A | | 11/2001 |
| JP | 2002-368238 A | | 12/2002 |
| JP | 2006-313810 A | | 11/2006 |
| JP | 2007-287845 A | | 11/2007 |
| JP | 2008-021745 A | | 1/2008 |
| WO | WO 01/38599 A1 | | 5/2001 |

OTHER PUBLICATIONS

Japanese Office Action in Japanese Application No. 2008-038003 dated Oct. 18, 2011.

Japanese Office Action in Japanese Application No. 2008-038004 dated Oct. 18, 2011.

Office Action ("Notice of Reasons for Rejection") dated Nov. 6, 2012 for corresponding Japanese Patent Application No. 2011-277611.

Ushiku, Y. et al, "Forming GaN thin film by high-frequency wave magnetron sputtering", 21st century joint symposium of Science technology and human, 2003, pp. 295-298.

Asami, A. et al., "Growth of Si or Mg-doped GaN single-crystalline layer by UHV sputtering method", No. 66 Japan Society of Applied Physics, pamphlet, 7a-N-4, (2005), p. 248.

Decision for Rejection issued in corresponding Japanese Patent Application No. 2008-038004 dated Aug. 14, 2012.

* cited by examiner

SOLAR CELL AND PROCESS FOR PRODUCING THE SAME

CROSS REFERENCE TO RELATED APPLICATIONS

This application is a Divisional of U.S. application Ser. No. 12/033,603 filed on Feb. 19, 2008, which claims benefit of U.S. Provisional Application No. 60/905,820, filed on Mar. 9, 2007, and claims priority of Japanese Patent Application No. 2007-38161 filed on Feb. 19, 2007, the contents of which are incorporated herein by reference.

BACKGROUND OF THE INVENTION

1. Field of the Invention

The present invention relates to a solar cell and a method of manufacturing the same, and more particularly, to a solar cell having a laminate structure of group-III nitride semiconductors (hereinafter, referred to as group-III nitride compound semiconductors) capable of achieving both mass productivity and excellent characteristics and to a method of manufacturing the same.

2. Description of the Related Art

It has been about thirty years since a technique for a solar photovoltaic system was developed, and energy consumption has rapidly increased all over the world. Meanwhile, most the countries ratified the Kyoto protocol in order to reduce greenhouse gases that cause climate change, and thus many countries have turned their attention to natural energy, particularly, solar photovoltaic power generation.

In particular, the solar photovoltaic market has been rapidly expanding since each country subsidized the development of the solar photovoltaic system. Due to an increase in the demand for silicon caused by the development of the semiconductor industry, a shortage in the supply of a silicon raw material has occurred in the solar photovoltaic market.

That is, with a rapid increase in demand for a polycrystalline silicon solar cell, which is the main product, a failure has occurred in the production plan of a crystalline raw material, and it is expected that a shortage in supply of the silicon raw material will occur in the near future. For this reason, the demand for reducing the thickness of silicon substrates has increased.

As a thin film solar cell, a solar photovoltaic system using, for example, an amorphous silicon thin film or a microcrystalline silicon thin film, has been known. In terms of development, a solar photovoltaic system using a compound semiconductor thin film formed of, for example, a CIS-based thin film having Cu, In, or Se as a base material, or a CIGS-based thin film containing Ga, has been paid attention.

Further, a solar photovoltaic system using a dye sensitization-type element containing a Ru-based pigment or an organic thin film element, which enables a flexible solar photovoltaic element, has been developed.

In order to expand the solar photovoltaic market, it is necessary to improve photoelectric conversion efficiency and reduce manufacturing costs. An InGaP/GaAs multi junction solar cell using a GaAs tunnel junction layer, which has been used as a power source for, for example, a satellite, has photoelectric conversion efficiency considerably higher than a silicon-based solar cell. However, has manufacturing costs are astronomically higher than the silicon-based solar cell. Therefore, it is difficult to use the In GaP/GaAs-based multi junction solar cell for general household purposes.

As examples of the solar cell using the compound semiconductor, the following have been proposed: a method of depositing a semiconductor multi-layer structure required for a multi-junction solar cell using an MOCVD method, thereby manufacturing a solar cell (for example, Patent Document 1 (Japanese Unexamined Patent Application Publication No. 2001-4445)); a 3-terminal multi-junction solar cell formed by depositing Ge layers as a lower cell and GaAs layers as an upper cell using the MOCVD method (for example, Patent Document 2 (Japanese Unexamined Patent Application Publication No. 2002-368238)); and a concentrating photovoltaic apparatus having a concentrator in an InGaP/InGaAs/Ge based multi junction solar cell (for example, Patent Document 3 (Japanese Unexamined Patent Application Publication No. 2006-313810)).

As a multi-junction tandem solar cell using a GaN-based material, the following has been proposed: a multi-junction tandem solar cell including a plurality of p-n junction layers that are formed by depositing $In_{(1-x)}Ga_{(x)}N$ (Eg is in a range of about 0.7 eV to 3.4 eV)-based thin films using an MBE method. However, details of a manufacturing method and performances thereof are not disclosed (for example, Patent Document 4 (U.S. Published Application No, 2004-0118451)).

The solar photovoltaic systems using the compound semiconductors according to the related art have problems in that methods of depositing solar cell element thin films are complicated, there is no disclosure of a method of increasing the size of an element substrate, power consumption is considerably higher than other energy sources, and the manufacturing costs are higher than those of the polycrystalline silicon solar cell according to the related art.

Meanwhile, as a method of growing crystals of a group-III nitride compound semiconductor, the following have been proposed: an MOCVD method of reacting ammonia with an organic metal, such as organic gallium or an organic indium compound, at a high temperature during the manufacture of a light emitting element; an MBE method; and a sputtering method (for example, Patent Document 5 (Japanese Unexamined Patent Application Publication No. 60-39819), Non-Patent Document 1 (Ushiku Yukiko et al., Deposition of GaN Thin Film Using RF Magnetron Sputtering Method (I), Second 21st Century Joint Symposium-Science and Technology, and Human Being-(2003, Tokyo)) and Non-Patent Document 2 (Asami Akinori et al., Growth of GaN Single Crystal doped with Si or Mg by UHV Sputtering Method, 66th Meeting of the Japanese Society of Applied Physics (The University of Tokushima, autumn 2005)). However, the method of growing crystal using the MBE method or the sputtering method has not been industrially used for a light emitting element of the compound semiconductor or the manufacture of a solar cell element.

SUMMARY OF THE INVENTION

The present invention has been made in an effort to solve the above problems, and an object of the present invention is to provide a solar cell that is useful for industry and a method of manufacturing the same.

The present invention has the following characteristics.

According to a first aspect of the present invention, a solar cell comprises: a substrate; a buffer layer that is formed on the substrate and is composed of a group-III nitride semiconductor; and group-III nitride semiconductor layers (p-type layer/n-type layer) having a p-n junction therein and is formed on the buffer layer. At least one selected from the group consisting of the buffer layer and the group-III nitride semiconductor layer having the p-n junction therein has a compound semiconductor layer formed by a sputtering method.

A second aspect of the solar cell according to the first aspect, a plurality of the group-III nitride semiconductor layers (p-type layer/n-type layer) having the p-n junction therein may be comprised in the solar cell element.

A third aspect of the solar cell according to the first aspect or the second aspect, the group-III nitride semiconductor layers (p-type layer/n-type layer) having the p-n junction therein, which is formed on the buffer layer, may be formed of $In_xGa_{(1-x)}N$ ($0 \leq x < 1$).

A fourth aspect of the solar cell according to any one of the first aspect to the third aspect, the substrate may be formed of at least one selected from the group consisting of quartz, glass, sapphire, SiC, silicon, zinc oxide, magnesium oxide, manganese oxide, zirconium oxide, manganese zinc iron oxide, magnesium aluminum oxide, zirconium boride, gallium oxide, indium oxide, lithium gallium oxide, lithium aluminum oxide, neodymium gallium oxide, lanthanum strontium aluminum tantalum oxide, strontium titanium oxide and titanium oxide.

A fifth aspect of the solar cell according to any one of the first aspect to the fourth aspect, an n-type electrode and a p-type electrode may be formed on at least a portion of or the entire surface of the group-III nitride semiconductor layer having the p-n junction therein.

A sixth aspect of the solar cell according to any one of the first aspect to the fifth aspect, the buffer layer may be formed of AlN or GaN.

A seventh aspect of the present invention, there is provided a method of manufacturing a solar cell. The method comprises: forming a buffer layer composed of a group-III nitride semiconductor on a substrate using a sputtering method; and forming a group-III nitride semiconductor layer and electrodes, on the buffer layer. The group-III nitride semiconductor layer is formed on the buffer layer by at least one selected from the group consisting of the sputtering method, a MOCVD method, an MBE method, a CBE method, and an MLE method, and then the electrodes are formed on the group-III nitride semiconductor layer.

An eighth aspect of the present invention according to the seventh aspect, at least one of group-III nitride semiconductor layers (p-type layer/n-type layer) having a p-n junction therein that are included in the group-III nitride semiconductor layer formed on the buffer layer may be formed by the sputtering method.

A ninth aspect of the present invention according to the seventh aspect or the eighth aspect, the sputtering method may comprise reacting nitrogen in a plasma, radical, or atomic state with a group-III element, thereby forming the layer.

A tenth aspect of the present invention according to any one of the seventh aspect to the ninth aspect may further comprise a first step of alternately repeating a process of supplying only dopant element and a process of simultaneously supplying a compound including group-III element and a nitrogen raw material.

An eleventh aspect of the present invention according to the tenth aspect may further include: a second step of performing a heat treatment on the layer formed by the first step.

A twelfth aspect of the present invention according to the eleventh aspect, a heat treatment temperature may be in a range of about 300° C. to about 1200° C.

A thirteenth aspect of the present invention according to the eleventh aspect or the twelfth aspect, the heat treatment may be performed in an atmosphere that does not contain a gas of a compound comprising hydrogen atom and hydrogen gas.

A fourteenth aspect of the present invention according to any one selected from the group consisting of the tenth aspect to the thirteenth aspect, the dopant element may be at least one of Si, Ge, and Sn.

A fifteenth aspect of the present invention according to any one of the tenth aspect to the thirteenth aspect, the dopant element may be at least one of Mg and Zn.

DETAILED DESCRIPTION OF THE INVENTION

The invention relates to a solar cell comprising at least a buffer layer that is composed of a group-III nitride semiconductor and a group-III nitride semiconductor layers (p-type layer/n-type layer) having a p-n junction therein, formed on a substrate, wherein at least one selected from the group consisting of the buffer layer and the group-III nitride semiconductor layers having the p-n junction therein has a compound semiconductor layer formed by a sputtering method and to a method of manufacturing the same.

Further, in the present invention, both an underlying layer that is composed of a group-III nitride semiconductor and is formed on the buffer layer and each of the group-III nitride semiconductor layers (p type layer/n-type layer) having a p-n junction therein are formed by the sputtering method.

Furthermore, in the present invention, a solar cell comprises the group-III nitride semiconductor layers having a p-n junction therein and may include at least a semiconductor multi-layer film in which an n-type layer and a p-type layer are preferably laminated in this order in the direction in which sunlight is incident. However, the laminated direction is not limited to the incident direction of sunlight. In addition, a multi junction solar cell having a tandem structure including a plurality of semiconductor layers, each having a p-n junction therein, may be formed on the same substrate.

In the solar cell according to the present invention, the group-III nitride semiconductor layer having a p-n junction therein, which is formed on the buffer layer, is preferably formed of $In_xGa_{(1-x)}N$ ($0 \leq x < 1$). Here, x indicates an arbitrary atom ratio, and is represented by, for example, X1 or X2, which will be described below. This is similarly applied to the following description hereinafter.

The buffer layer is preferably formed of GaN or AlN, but the invention is not limited thereto. The thickness of the buffer layer is generally in a range of about 1 nm to about 1000 nm, preferably, about 3 nm to about 400 nm, more preferably, about 5 nm to about 200 nm.

After the buffer layer is formed, an underlying layer may be formed between the buffer layer and the p-n junction layer.

The underlying layer is formed of a group-III nitride semiconductor, preferably, $In_xGa_{(1-x)}N$ ($0 \leq x < 1$), more preferably, GaN layer.

Further, in the present invention, when the buffer layer is formed by a sputtering method, the buffer layer has high uniformity. As a result, when the underlying layer is subsequently formed on the buffer layer, it is possible to reduce the threading dislocation in the underlying layer. In particular, the buffer layer formed by the sputtering method has a thickness smaller than that of the buffer layer formed by an MOCVD method, also has in-plane uniformity higher than that of the buffer layer formed by the MOCVD method. For example, it is possible to obtain an underlying layer having the following characteristics: the rocking curve half-width of a (0002) plane is equal to or less than about 100 arcsec; and the rocking curve half-width of a (10-10) plane is equal to or less than about 300 arcsec.

Since the underlying layer having excellent characteristics is formed, a solar cell having a p-n junction which is formed on the underlying layer can have excellent characteristics on the property of the solar cell. In addition, even when the underlying layer is not formed, it is possible to produce a solar cell with excellent characteristics due to forming a group-III nitride semiconductor layers (p-type layer/n-type layer) having a p-n junction therein.

Furthermore, a substrate may be put into a chamber of a sputtering apparatus, and may be carried out by pre-treatment such as sputtering before a buffer layer is formed. Specifically, a pre-treatment of cleaning the surface of the substrate by exposing the substrate to Ar or $N_2$ plasma in the chamber may be performed. It is possible to remove an organic material or an oxide adhered to the surface of the substrate by exposing the substrate to the plasma, such as Ar gas or $N_2$ gas. In this case, when a voltage is applied between the substrate and the chamber, not to a target, plasma particles effectively act on the substrate.

Figure 1:
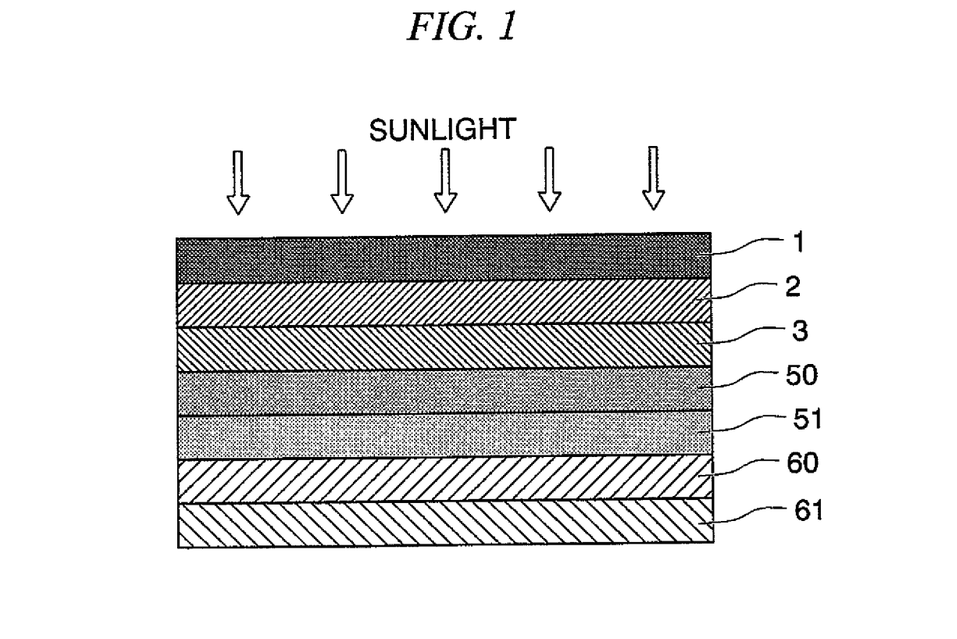
FIG. 1 is a cross-sectional view schematically illustrating an example of the structure of a solar cell element including a GaN junction layer, manufactured according to Example 1 in the present invention.

After the pre-treatment is performed on the substrate, the buffer layer shown in FIG. 1 is formed on the substrate by the sputtering method.

In general, the sputtering method can maintain the substrate at a low temperature. Therefore, even when a substrate formed of a material that is decomposed at a high temperature is used, the sputtering method makes it possible to form a layer on the substrate 11 without damaging the substrate.

Furthermore, in the present invention, the crystallinity of the buffer layer is not particularly limited. The buffer layer may be polycrystal (for example, columnar crystal) or single crystal. It is preferable that the buffer layer be single crystal.

The underlying layer, if necessary, may be doped with n-type impurities or it may be undoped ($<1 \times 10^{17}/cm^3$). Preferably, the underlying layer is undoped in order to maintain good crystallinity.

Further, the underlying layer may be an electro conducting layer by doping with dopant, thereby forming electrodes on and underneath a p-n junction element.

The thickness of the underlying layer is generally in a range of about 0.01 μm to about 30 μm, preferably, about 0.05 μm to about 20 μm, more preferably, about 0.1 μm to about 10 μm. However, the invention is not limited thereto.

Group-III nitride semiconductor layers having a plurality of p-n junctions therein may be connected to each other by a tunnel junction or ohmic electrodes.

In an embodiment of the present invention, the substrate (a different kind of substrate) may be different from a substrate composed of a group-III nitride semiconductor or a material that is crystal-grown on a substrate. For example, as different kind of substrate, one selected from the group consisting of quartz, glass, sapphire, SiC, silicon, zinc oxide, magnesium oxide, manganese oxide, zirconium oxide, manganese zinc iron oxide, magnesium aluminum oxide, zirconium boride, gallium oxide, indium oxide, lithium gallium oxide, lithium aluminum oxide, neodymium gallium oxide, lanthanum strontium aluminum tantalum oxide, strontium titanium oxide, and titanium oxide may be preferably used. More preferably, at least one selected from the group consisting of quartz, glass, sapphire, SiC, and silicon may be used. More preferably, the substrate may be used of quartz, glass, or sapphire.

Hereinafter, exemplary embodiments of the present invention will be described with reference to the accompanying drawings. The drawings are simply illustrative, but the scale of each layer or member is adjusted in order to have a recognizable size in the drawings.

Figure 3:
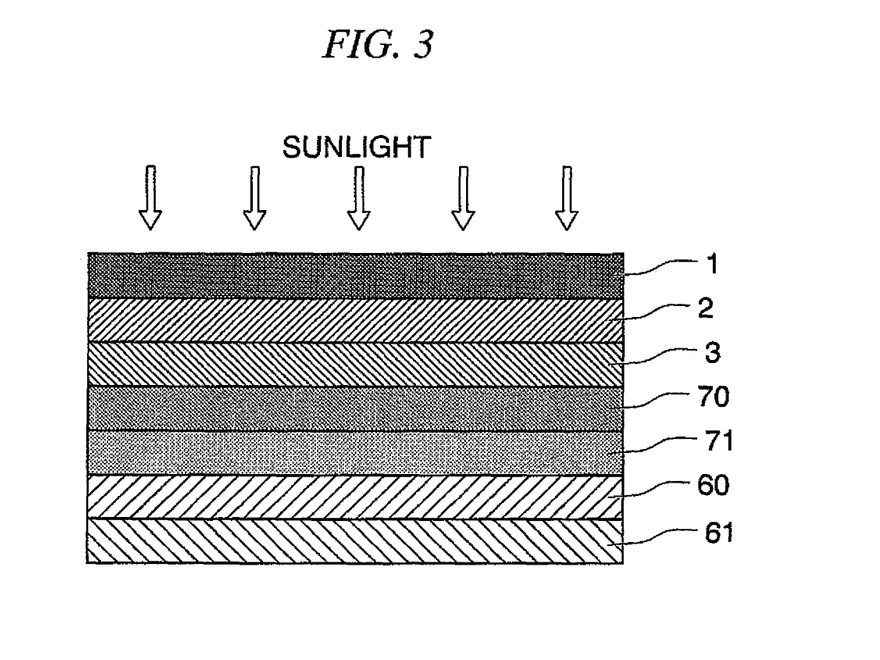
FIG. 3 is a cross-sectional view schematically illustrating an example of the structure of a solar cell element including an $In_{X1}Ga_{1-X1}N$ junction layer, manufactured according to Example 2 in the present invention.
Figure 4:
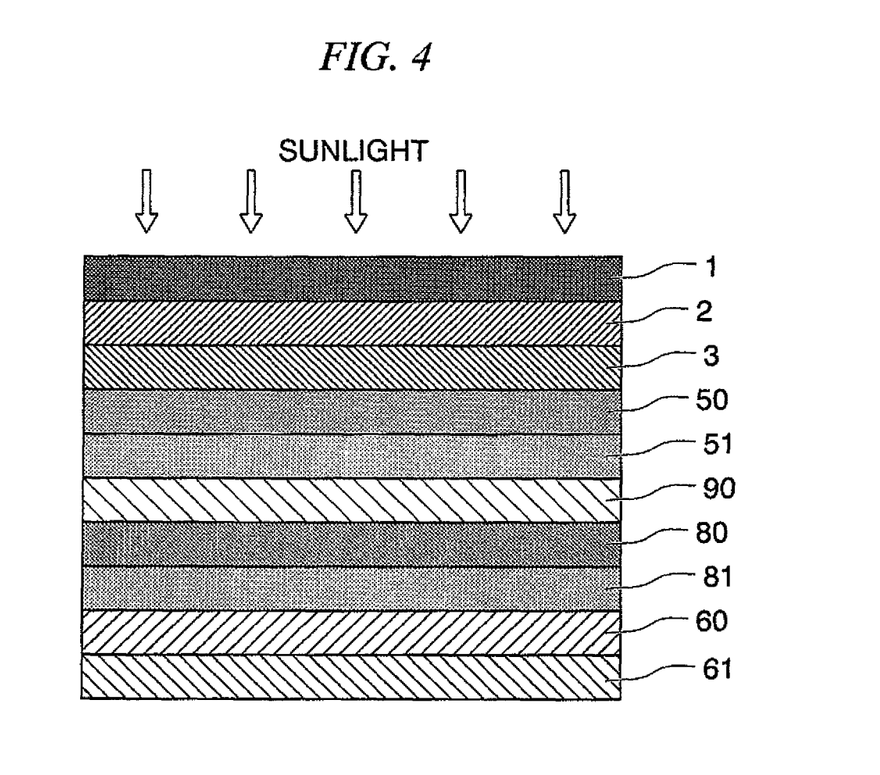
FIG. 4 is a cross-sectional view schematically illustrating an example of the structure of a solar cell element having two junctions of a GaN junction layer and an $In_{X2}Ga_{1-X2}N$ junction layer according to the present invention.

Next, a solar cell having the above-mentioned structure will be described. In FIGS. 1, 3, and 4, the incident direction of sunlight is not limited to that shown in the drawings, but sunlight may be incident in the opposite direction of that shown in the drawings.

FIG. 1 is a longitudinal cross-sectional view illustrating an example of the structure of a solar cell element that has a p-n junction therein and is formed of GaN. A p-type GaN layer 50 and an n-type GaN layer 51 that have a p-n junction therebetween are laminated on a quartz substrate 1 with an AlN buffer layer 2 and an undoped GaN underlying layer 3 with interposed therebetween, and an ITO (indium tin oxide) of an ohmic electrode 60, serving as a current collecting electrode, is formed on the semiconductor layer having a p-n junction therein. The surface of the electrode may be covered with a protective film 61, if necessary. Any layer may be used as the protective film 61 as long as it can protect the ohmic electrode. A known antireflection film (for example, a $MgF_2/ZnS_2$ film) is formed on the surface of the laminate on which sunlight is incident.

FIG. 3 is a longitudinal cross-sectional view illustrating an example of the structure of a solar cell element including p-type and n-type InGaN layers 70 and 71 that are formed of $In_{x1}Ga_{(1-x1)}N$ and have a p-n junction therebetween, instead of the p-type and n-type GaN layers 50 and 51 having a p-n junction therebetween shown in FIG. 1.

In this embodiment of the present invention, a plurality of compound semiconductor layers each having a p-n junction may be formed on the substrate. In this case, a tunnel junction layer having a high tunnel peak current density is formed between the junction layers. FIG. 4 is a longitudinal cross-sectional view illustrating an example of the structure of a solar cell element including two compound semiconductor layers, each having a p-n junction therein, formed on a substrate.

In a group III-V compound semiconductor layer, generally, group-V molecules are evaporated from the surface of the layer at a temperature of about 400° C. or more. Therefore, it is possible to obtain a tunnel peak current density of 50 mA/cm² or more by performing heat treatment on the tunnel junction layer formed of $In_xGa_{(1-x)}N$ ($0 \leq x < 1$) at a relatively high temperature of about 400° C. to about 800° C. in a short amount of time (for example, several seconds). However, the thermal treatment may be performed for ten minutes or more at a relatively low temperature of about 300° C. to about 400° C. Since the tunnel junction layer also absorbs light and causes a light absorption loss, the tunnel junction layer may have a sufficiently small thickness to obtain desired tunnel junction characteristics, preferably, a thickness of 10 nm or less.

In FIGS. 1 and 3, an ohmic contact electrode (ohmic electrode) 60, serving as a rear electrode, formed of, for example, ITO is formed on one surface of the p-type GaN layer 51 or the p-type $In_{X1}Ga_{1-X1}N$ layer 71, and an electrode formed of, for example, Au is formed on the ohmic electrode 60. The surface of the compound semiconductor is partially processed by a known photolithography method and a known etching method (including dry etching) using the n-type GaN layer 50 or the n-type $In_{X1}Ga_{1-X1}N$ layer 70 as a contact layer, thereby forming a pad electrode. The pad electrode is formed of, for example, Cr, Ti, or Au.

For example, the AlN buffer layer shown in FIGS. 1 and 3 is formed on the quartz substrate by a sputtering method. In this case, generally, the semiconductor layers other than the AlN buffer layer are epitaxially grown by a MOCVD method.

FIG. 4 is a longitudinal cross-sectional view illustrating an example of the structure of a solar cell element including the p-type and n-type GaN layers (50 and 51) having a p-n junction therebetween and p-type and n-type $In_{X2}Ga_{1-X2}N$ layers (80 and 81) having a p-n junction therebetween. The laminate structure of the compound semiconductors shown in FIG. 4 can be manufactured by the same method as described with reference to FIGS. 1 and 3.

The n-type semiconductor according to this embodiment of the present invention is not particularly limited as long as it is doped with an n-type dopant showing the effect of the solar cell. For example, the n-type semiconductor may preferably contain at least one kind of element selected from the group consisting of Si, Ge, and Sn. The p-type semiconductor is not particularly limited as long as it is doped with a p-type dopant showing the effect of the solar cell. For example, the p-type semiconductor may preferably contain at least one kind of element selected from a group consisting of Mg and Zn.

In this embodiment of the present invention, a junction cell is not particularly limited as long as it has the effect of the solar cell. For example, the junction cell may have a thickness of about 0.1 to about 3 µm, each of the n-type $In_xGa_{(1-x)}N$ layer (0≤x<1) and the p-type $In_xGa_{(1-x)}N$ layer (0≤x<1) may have a thickness of about 20 nm to about 1.5 µm, and the concentration of impurities may be in a range of about $4 \times 10^{17}$ to $4 \times 10^{18}$ cm$^{-3}$.

Next, a method of forming the laminate structure of the group-III nitride semiconductors forming the solar cell according to the present invention will be described.

In this embodiment, as described above, the AlN layer is formed on the substrate by the sputtering method, and the underlying layer is formed thereon by the sputtering method, the MOCVD method, or other methods. Then, the group-III nitride semiconductor layer having a p-n junction therein is formed on the underlying layer.

In this embodiment, when the sputtering method is used to form a doping layer of the group-III nitride semiconductor layer having the p-n junction, a layer containing a dopant atom and an undoped III nitride semiconductor layer are alternately laminated as repeated, and subsequently doping is performed on the laminate layers.

When a chemical vapor deposition method, such as the MOCVD method, is generally used, gas is mixed to perform doping. However, in the above-mentioned method, it is possible to improve the productivity and reproducibility by the performance of the MOCVD method without performing such as gas-mixing method.

In a method of physically forming a crystal film using the sputtering method, plasma, radical, or atomized nitrogen is supplied. It is preferable that nitrogen not be supplied to a chamber during a process of supplying dopant atoms, in order to prevent the reaction between the dopant atoms and the nitrogen.

In the embodiment of the present invention, a method of alternately performing a process of supplying only a dopant and a process of forming the group-III nitride semiconductor using nitrogen is provided. In the laminate structure formed by this method, layers containing only the dopant and the undoped group-III nitride semiconductor layers are alternately laminated. During the process of alternately laminating the layers, some of the dopant atoms of the doping layer may be diffused to the group-III nitride semiconductor layers. However, in this stage, the layer containing only the dopant atoms is required.

Dopant comprising the layer may be p-type dopant or n-type dopant. For example, Mg or Zn has been used as the p-type dopant for the group-III nitride semiconductor, and Si, Ge, or Sn has been used as the n-type dopant for the group-III nitride semiconductor. Among the above-mentioned elements, preferably, Si is used as the n-type dopant and Mg is used as the p-type dopant since they have high doping efficiency, high activation rate, and low reduction in crystallinity.

It is preferable that the group-III nitride semiconductor layer crystal forming the layer have an $In_xGa_{(1-x)}N$ (0≤x<1) structure.

When the doping layer fully covers the group-III nitride semiconductor layer, an epitaxial relation is not established therebetween since they have different crystal lattice constants, which results in a reduction in crystallinity. For this reason, the doping layer is preferably formed to be scattered in island shapes on the surface of the group-III nitride semiconductor layer without forming a complete layer. When the doping layer is formed in island shapes, the crystal of the group-III nitride semiconductor is epitaxially grown in the exposed portions of the doping layer. In this way, it is possible to completely fill the exposed portions by epitaxial growth in the lateral direction.

It is preferable that the island-shaped portions of the island-shaped doping layer may be arranged at an interval of about 2 nm to about 100 nm in the width direction. If the gap between the island-shaped portions is smaller than the above range, it is difficult for the group-III compound semiconductor crystal to be epitaxially grown in the gap. On the other hand, if the gap between the island-shaped portions is larger than the above range, dopants are not sufficiently diffused, which causes an increase in the driving voltage for an element. More preferably, the island-shaped portions are arranged at an interval of about 10 nm to about 50 nm in the width direction.

It is preferable that the ratio of the total area of the island-shaped portions of the island-shaped doping layer to the area of the entire surface of the island-shaped doping layer be in a range of about not less than 0.001% to not more than 0.9%. If the total area is larger than the above range, it is difficult for the group-III compound semiconductor crystal to be epitaxially grown in the gap. On the other hand, if the total area is smaller than the above range, dopants are not sufficiently diffused, which causes an increase in the driving voltage for an element. More preferably, said ratio of the total area of the island-shaped portions of the island-shaped doping layer is in a range of about 0.005 to 0.5 of the area of the entire surface of the island-shaped doping layer.

It is preferable that the island-shaped portions of the doping layer have a diameter (corresponding to the diameter of a circle) of about 0.5 nm to about 100 nm. If the diameter of the island-shaped portion is smaller than the above range, dopants are not sufficiently diffused, which causes an increase in the driving voltage for an element. On the other hand, if the diameter of the island-shaped portion is larger than the above range, the crystallinity of the group-III compound semiconductor crystal is lowered. More preferably, the diameter of the island-shaped portion is in a range of about 1 nm to about 10 nm.

The diameter of the island-shaped portions of the island-shaped doping layer and the gap between the island-shaped portions can be measured by observing a sample with the cross-section thereof exposed using a transmission electron microscope. In addition, the ratio of the total area of the island-shaped portions to the area of the entire surface of the doping layer can be calculated by measuring the diameters of the island-shaped portions and the gaps therebetween at, for example, 10 measurement points selected by random sampling and calculating the average of the measured values.

Film deposition conditions may be considered in order to form the doping layer composed of the island-shaped portions. Since the doping layer is not lattice-matched with the group-III nitride semiconductor layer, it is possible to form crystal islands under the controls that active migration occurs.

For example, it is possible to set the temperature of the substrate to about 600° C. or more, the pressure of the chamber to about 0.3 Pa or less during deposition, and the deposition rate to about 0.5 nm/sec or less. The thickness of the layer comprising only the dopant is preferably in a range of about 0.1 nm to about 10 nm. If the thickness is smaller than the above range, dopants are likely to be insufficiently diffused. On the other hand, if the thickness is larger than the range, it is difficult to completely fill the exposed portions of the doping layer even when the group-III nitride semiconductor crystal is epitaxially grown in the lateral direction. More preferably, the thickness is in a range of about 0.5 nm to about 5 nm.

It is preferable that the thickness of the group-III nitride semiconductor layer be in a range of about 1 nm to about 500 nm. If the thickness is larger than the range, dopants are likely to be insufficiently diffused. On the other hand, if the thickness is smaller than the range, it is difficult to completely fill up the exposed portions of the doping layer even when the group-III nitride semiconductor crystal is epitaxially grown in the lateral direction. More preferably, the thickness is in a range of about 10 nm to about 100 nm.

Further, it is preferable that the ratio of the thicknesses of the two layers (the ratio of the thickness of the group-III nitride semiconductor layer to the thickness of the doping layer) be in a range of about 10 to about 1000. If the ratio is smaller than the above range, an excessively large amount of dopant is doped, which causes the deterioration of the crystallinity of the group-III nitride semiconductor crystal. On the other hand, if the ratio is larger than the above range, dopants are not sufficiently diffused, and the resistance of the laminate structure increases. As a result, a driving voltage increases.

The number of repeating for laminates of the group-III nitride semiconductor layer and the doping layer formed in the first process is preferably in the range of 1 to about 200. Even when the repeating number of laminates is larger than about 200, there is no improvement in the performance of the element, but only the crystallinity of the element is lowered.

For example, sputtering, PLD, PED, and CVD have been known as a method of supplying a nitrogen raw material as plasma or radical. Among the methods, the sputtering method is preferable since it is easy to perform and is suitable for mass production. A DC sputtering method may cause the charge-up of the surface of a target, and a deposition rate is more likely to be unstable. Therefore, a pulse DC method or an RF sputtering method is preferable.

In the embodiment in the present invention, a known compound may be used as a raw material for generating plasma or radical nitrogen. Particularly, it is preferable to use ammonia and nitrogen since they are inexpensive and easy to handle. Ammonia has advantages in that it has high degradation efficiency and can be deposited at a high deposition rate. However, the ammonia has disadvantages in that it has high reactivity and toxicity, it is necessary to provide ammonia removal equipment or a gas detector, and members used for a reactor need to be formed of a material having high stability. On the other hand, when nitrogen is used as a raw material, the structure of an apparatus is simplified, but it is difficult to obtain a high reaction rate. A method of decomposing nitrogen using an electric field or heat and introducing it into the apparatus can obtain a sufficiently high deposition rate to use, which is lower than that when ammonia is used. Therefore, nitrogen is the most preferable nitrogen material in consideration of the manufacturing costs and the balance of an apparatus.

When sputtering is used to form the layer, important parameters are the temperature of the substrate, the internal pressure of a furnace, and the partial pressure of nitrogen. The temperate of the substrate is generally in the range of room temperature to about 1200° C. If the temperature is higher than about 1200° C., crystal decomposition occurs. Preferably, the temperature of the substrate is in a range of about 200° C. to about 900° C.

It is preferable that the internal pressure of the furnace be greater than or equal to about 0.3 Pa. If the internal pressure is lower than the value, the amount of nitrogen is reduced in the furnace, and the sputtered metal does not become a nitride, but is deposited to the layer. The upper limit of the pressure is not particularly limited, but it should be understood that a sufficiently low pressure to generate plasma is required. It is preferable that, for the ratio of the flow rates of nitrogen to the flow rate of nitrogen and argon, nitrogen is in a range of about 20 percent by volume to about 100 percent by volume. If the flow rate of nitrogen is lower than 20%, the sputtered metal is deposited as metal. More particularly, the flow rate of nitrogen is in a range of about 50% to about 90%. If the flow rate is greater than or equal to about 90%, the amount of argon is small and the sputtering rate tends to be lowered.

It is preferable that the deposition rate be in a range of about 0.01 nm/sec to about 10 nm/sec. If the deposition rate is higher than the above range, a film is not crystallized, but becomes amorphous. If the deposition rate is lower than the above range, a film is not formed, but the film is grown in an island shape. Therefore, it is difficult to cover the surface of the substrate.

Meanwhile, since the doping layer is formed of a single component, a reactive sputtering method is not preferable. Therefore, both an RF sputter and a DC sputter can be used as a sputtering apparatus. When the DC sputter is used, an electroconducting target may be used such that the target is not charged. For example, when a target with high purity, such as Si, is used, the target has an insulating property, and the charge-up thereof should be considered. Therefore, it is preferable to use a target doped with B or P. However, in the DC sputter, it is a waste of time to reciprocate a wafer in the chamber when layers are alternately laminated as repeated. Therefore, it is preferable that the layers be laminated in the same chamber as that in which the group-III nitride semiconductor is made. Consequently, it is preferable to use the RF sputter.

It is preferable that the internal pressure of the furnace and the temperature of the substrate in the process of forming the doping layer be the same as those in the process of forming the group-III nitride semiconductor, for the same reason as described above. The deposition rate is preferably lower than that in the process of forming the group-III nitride semiconductor. This is because it is easy to accurately control the thickness of the layer. Preferably, the deposition rate is in a range of about 0.001 nm/sec to about 1 nm/sec.

It is preferable that, after the doping layer and the group-III nitride semiconductor layer are alternately laminated as repeated, to form a laminate structure, a heat treatment, which is a second process, be performed on the laminate structure. The heat treatment makes it possible for dopant to be diffused in the group-III nitride semiconductor crystal. As a result, it is possible to perform uniform doping state.

It is preferable that the heat treatment be performed at a temperature of about 300° C. or more. The upper limit of the heat treatment temperature is not particularly limited, but the heat treatment temperature needs to be lower than the temperature at which matrix crystal is decomposed. Generally, most of the group-III nitride semiconductor crystal is decomposed at a temperature of about 1200° C.

The heat treatment time is not particularly limited, but it is preferably in the range of about 30 seconds to about one hour. If the heat treatment time is shorter than about 30 seconds, it is difficult to obtain sufficient heat treatment effects. On the other hand, if the heat treatment time is longer than about one hour, there is no improvement in the heat treatment effects, which results in a waste of time.

For the atmosphere during the heat treatment, particularly, when forming a p-type doping layer to manufacture a p-type laminate structure, it is preferable not to use hydrogen gas and compound gas combined with hydrogen atoms in molecule. In particular, it is preferable not to use $H_2$ gas or $NH_3$ gas that is decomposed at a high temperature to generate $H_2$ gas.

In the laminate structure subjected to the heat treatment, the dopant may form a crowd as the trace of the doping layer therein, depending on the heat treatment time and temperature thereof. The mass of the dopant is diffused to be removed. For the concentration of the dopant, highly doped layers and lightly doped layers may be alternately arranged. The dopant may be uniformly diffused in to form an entirely homogeneous doping layer.

Therefore, the laminate structure subjected to the heat treatment serves as a contact layer. When the p-type doping layer is used, the laminate structure is used as a p-type contact layer. When the n-type doping layer is used, the laminate structure is used as an n-type contact layer.

Electrodes for passing through-current are formed on the contact layer. The electrodes can be formed of any known material. For example, an n-type electrode may be formed, for example, Al, Ti, or Cr, etc. and a p-type electrode may be formed of, for example, Ni, Au, or Pt, etc. The electrodes may be formed of an electro conductive oxide, such as ITO, ZnO, AZO, or IZO.

EXAMPLES

Next, the invention will be described in detail with reference to Examples. However, the present invention is not limited to the following Examples.

Example 1

In Example 1, a method of manufacturing a group-III nitride semiconductor laminate structure forming a solar cell element will be described.

FIG. 1 is a cross-sectional view illustrating the laminate structure manufactured according to Example 1. The following was formed on the quartz substrate 1 available on the market: AlN buffer layer 2 with a thickness of 30 nm, the undoped GaN layer 3 with a thickness of 0.1 μm, the n-type GaN layer 50 with a thickness of about 0.5 μm that was formed by alternately laminating Si-doped layer (having a thickness of 2 nm), which is composed of crystal islands, and undoped GaN layer (having a thickness 100) nm as repeated for forty times and by performing a heat treatment on the laminate, and the p-type GaN layer 51 with a thickness of 0.5 μm that was doped with Mg and manufactured by the same method as described above. A method of manufacturing the n-type and p-type doping layers will be described below. The carrier concentration of the n-type GaN layer 50 was about $2 \times 10^{18}$ atoms/cm$^3$, and the carrier concentration of the p-type GaN layer was about $2 \times 10^{18}$ atoms/cm$^3$. These layers were formed by an RF magnetron sputter.

A sputter in which the distance between a target and a cathode is 50 mm was used for the manufacturing method. During the deposition of the layers, the temperature of the substrate was 750° C., and the pressure was 0.6 Pa. A substrate having a length of 30 cm (optical substrate), which is available on the market, was used as the quartz glass substrate.

In the manufactured laminate, the ohmic electrode layer 60 made of ITO was formed on the surface of the p-type GaN layer 51 by a known photolithography technique, and a rear electrode, which was a laminate of a titanium film, an aluminum film, and a gold film formed in this order, was provided on the surface of the ohmic electrode layer. Instead of the ITO, a separate crystalline IZO was used to form the ohmic electrode. The crystalline IZO had high processability using the etching property of an amorphous IZO, which was a precursor.

Then, a known etching process (for example, dry etching) was performed on the rear surface of the electrode of the laminate, thereby exposing a portion of the n-type GaN layer 50 for forming an n-type electrode, and the n-type electrode, which is a laminate of four layers, that is, Ni, Al, Ti and Au layers, was manufactured in the exposed portion. In this way, a solar cell element was manufactured.

In the process of forming the AlN buffer layer 2, a mixed gas of argon and nitrogen was introduced into the chamber, an electric field was applied to generate nitrogen plasma, and the nitrogen plasma was used as a nitrogen source, Meanwhile, argon ions in the plasma collided with an Al target, and metal atoms were emitted from the Al target and reacted with nitrogen, thereby forming a film on the substrate.

In the process of forming the undoped GaN underlying layer 3, similar to the process of forming the AlN layer, a mixed gas of argon and nitrogen was introduced into the chamber, an electric field was applied to generate nitrogen plasma, and the nitrogen plasma was used as a nitrogen source. Argon ions in the plasma collided with a Ga target, and Ga atoms were emitted from the Ga target and reacted with nitrogen, thereby forming a film on the substrate.

For a layer for forming the n-type doped layer, in the process of alternately laminating the undoped GaN layer and the Si layer as repeated, the undoped GaN layer was formed by the same method as that used to form the undoped GaN underlying layer 3. The Si layer was formed as follows: only argon gas was introduced into the chamber; and argon ions collided with a Si target, and Si atoms were emitted to the surface of the substrate.

The substrate manufactured in this way was taken out from the sputter, and put into an annealing furnace to be subjected to heat treatment. A heat treatment temperature was 1100° C. and was maintained for 10 minutes. The heat treatment was performed in only a nitrogen atmosphere.

Further, before and after the annealing process, the n-type GaN layer 50 was observed by a transmission electron microscope in the cross-sectional direction. Before the annealing process, the laminates as repeated for 40 times, each composed of a Si layer with a thickness of 2 nm and an undoped GaN layer with a thickness of 100 nm, were observed in the laminated structure. The observation showed that the Si layer was not continuously formed, but had circular island portions formed therein. The diameter of the circular island portion was about 1 nm, and the gap between the circular island portions was about 50 nm. Therefore, the ratio of the total area of the doping layer to the entire surface of the Si layer was about 0.02. In the n-type GaN layer 50 after the annealing process, a definite layer structure was not observed. It was considered that Si atoms of the doping layer were diffused and the GaN layer was uniformly doped.

The solar cell element substrate manufactured in this way was divided into square substrates with a length of 1 cm for clarity of description, and the electrodes of the square substrate were connected to a lead frame by gold lines, thereby manufacturing a solar cell element.

Figure 2:
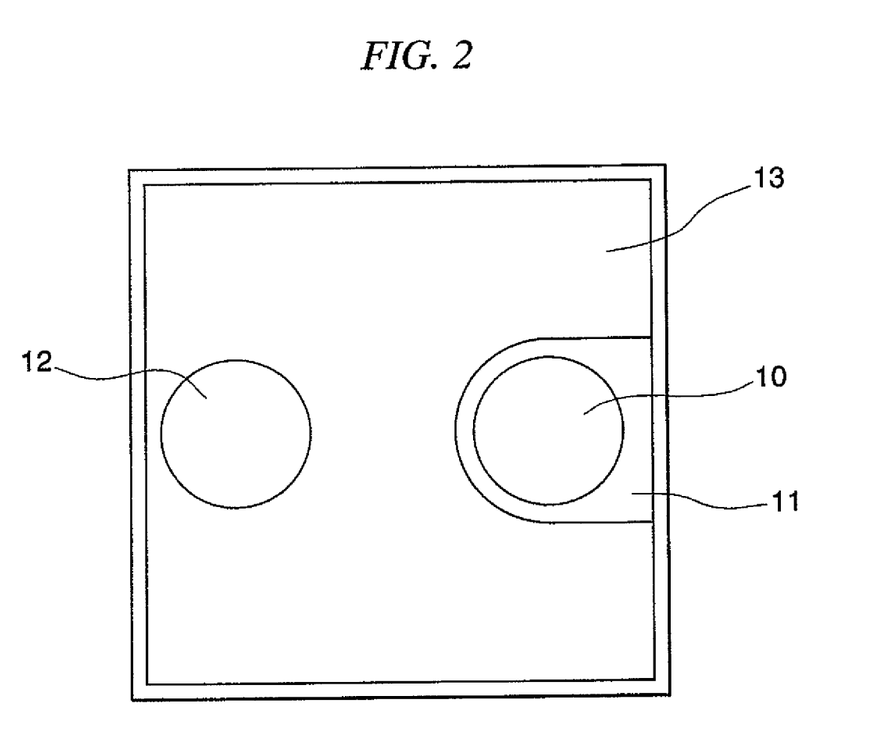
FIG. 2 is a plan view illustrating an example of the electrode structure of the solar cell element manufacturing according to Example 1 in the present invention.

FIG. 2 is a plan view illustrating an example of the structure of the electrode of the manufactured solar cell element.

Example 2

Next, another method of manufacturing the laminate structure shown in FIG. 1 will be described. An AlN buffer layer 2 with a thickness of 30 nm was formed on the quartz substrate 1 using an RF magnetron sputter, and then taken out from the sputter. Then, the AlN buffer layer was put into an annealing furnace, and heat treatment was performed thereon at a temperature of 1100° C. and under a nitrogen atmosphere for 10 minutes. Then, the treated substrate was put into an MOCVD furnace, and the same laminate as that in Example 1, that is, a laminate including the p-type GaN layer 51 doped with Mg was manufactured. In the MOCVD method, for example, the temperature, the pressure, and the gas used were the same as those in a known method. The carrier concentration of the n-type GaN layer 50 was about $2 \times 10^{18}$ atoms/cm$^3$, and the carrier concentration of the p-type GaN layer 51 was about $2 \times 10^{18}$ atoms/cm$^3$.

A solar cell element substrate was manufactured by the same method as that used in Example 1 using the manufactured laminate. The solar cell element substrate manufactured in this way was divided into square substrates with a length of 1 cm, and the electrodes of the square substrate were connected to a lead frame by gold lines, thereby manufacturing a solar cell element.

Example 3

FIG. 3 is a cross-sectional view illustrating a laminate structure according to Example 3. An AlN buffer layer 2 with a thickness of 30 nm was formed on the quartz substrate 1 using an RF magnetron sputter, and then taken out from the sputter. Then, the AlN buffer layer was put into an annealing furnace, and heat treatment was performed thereon at a temperature of 1100° C. and under a nitrogen atmosphere for 10 minutes. Then, the substrate was put into an MOCVD furnace, and the following are sequentially deposited on the substrate by a known MOCVD method (for example, temperature, pressure, and gas used) to form a laminate: the undoped GaN layer 3 with a thickness of 6 μm; the n-type $In_{X1}Ga_{1-X1}N$ layer (X1=0.09) 70 with a thickness of 0.1 nm; and the p-type $In_{X1}Ga_{1-X1}N$ layer (X1=0.09) 71 that is doped with Mg and has a thickness of 0.2 μm. The carrier concentration of the n-type $In_{X1}Ga_{1-X1}N$ layer 70 was about $3 \times 10^{18}$ atoms/cm$^3$, and the carrier concentration of the p-type $In_{X1}Ga_{1-X1}N$ layer 71 was about $3 \times 10^{18}$ atoms/cm$^3$. A solar cell element substrate was manufactured by the same method as that in Example 1 using the sputter and the laminate.

The solar cell element substrate manufactured in this way was divided into square substrates with a length of 1 cm, and the electrodes of the square substrate were connected to a lead frame by gold lines, thereby manufacturing a solar cell element.

Example 4

In Example 4, first, as a buffer layer, a single crystal layer made of AlN was formed on a c-plane of a substrate made of sapphire by an RF sputtering method, and as an underlying layer, a layer made of GaN (a group-III nitride compound semiconductor) was formed as follows by an MOCVD method. Then, the layers were laminated on the underlying layer.

First, a (0001) c-plane sapphire substrate with a diameter of 2 inches, which was subjected to mirror polishing, was introduced into the chamber. In this case, an RF sputter was used, and an Al target was used.

Then, the substrate in the chamber was heated up to 500° C., and a nitrogen gas was introduced into the chamber. Then, a high-frequency bias was applied to the substrate to generate nitrogen plasma, thereby cleaning the surface of the substrate.

Then, while the temperature of the substrate is maintained, argon and nitrogen gases were introduced into the sputter. Subsequently, a high-frequency bias was applied to the Al target, and while the internal pressure of the furnace is maintained at 0.5 Pa, a predetermined amount of Ar gas and a predetermined amount of nitrogen gas flowed, thereby forming a single crystal buffer layer made of AlN on the sapphire substrate.

Then, the deposition process was performed for a predetermined time according to a predetermined deposition rate to form an AlN (buffer layer) layer with a thickness of 40 nm, and the plasma process stopped to reduce the temperature of the substrate.

Subsequently, an X-ray rocking curve (XRC) of the buffer layer formed on the substrate was measured by an X-ray diffractometer (X'pert Pro MRD manufactured by SPECTRIS PLC). The result showed that the half-width of the XRC of the buffer layer was 0.1°, which is a good value, and the alignment of the buffer layer was good. This measurement was made by using a CuKα X-ray source as a light source.

Then, the substrate having the AlN layer formed thereon was taken out from the sputter, and then carried into an MOCVD apparatus. Then, the underlying layer made of GaN was formed on the buffer layer as follows.

First, the substrate was put into a reaction furnace (the MOCVD apparatus). Then, a nitrogen gas was introduced into the reaction furnace, and a heater was operated to increase the temperature of the substrate from a room temperature up to 500° C. Then, while the temperature of the substrate is maintained at 500° C., NH$_3$ gas and nitrogen gas were introduced to keep the internal pressure of the vapor deposition reaction furnace at 95 kPa. Successively, the temperature of the substrate was increased up to 1000° C. to thermally clean the surface of the substrate. The nitrogen gas was continuously supplied to the vapor deposition reaction furnace even after the thermal cleaning was completed.

Thereafter, while continuously supplying ammonia gas, the temperature of the substrate was increased up to 1100° C. in a hydrogen atmosphere, and the internal pressure of the reaction furnace was kept at 40 kPa. After checking that the temperature of the substrate was stabilized at 1100° C., the supply of trimethylgallium (TMG) into the vapor deposition reaction furnace was started, and a process of forming a group-III nitride compound semiconductor (GaN) forming the underlying layer on the buffer layer was started. After depositing GaN in this way, a valve of the TMG supply pipe was switched to stop the supply of a raw material into the reaction furnace, thereby stopping the deposition of GaN.

In this way, the undoped GaN underlying layer with a thickness of 8 μm was formed on the single crystal AlN buffer layer formed on the substrate.

Thereafter, the following were sequentially formed on the underlying layer by the same method as that in Example 1 to manufacture a laminate structure: the n-type GaN layer 50 with a thickness of about 0.5 μm that was formed by alternately laminating Si-doped layers (each having a thickness of 2 nm), each of which was composed of crystal islands, and undoped GaN layers (each having a thickness 100 nm) as repeated for forty times and by performing a heat treatment on the laminate; and the p-type GaN layer 51 with a thickness of about 0.5 μm that was doped with Mg and manufactured by the same method as described above. In this way, a solar cell element was manufactured. In addition, the ohmic electrode layer made of ITO according to Example 1 was substituted for an electrode layer made of IZO (bixbyite crystal).

Example 5

In Example 5, a solar cell element was manufactured by the same process as that in Example 3 except that X1 was 0.06 in the n-type $In_{X1}Ga_{1-X1}N$ layer (X1=0.09) and the p-type $In_{X1}Ga_{1-X1}N$ layer (X1=0.09).

Example 6

The solar cell element substrate manufactured by the method according to Examples 1 to 4 was divided into square substrates each having a length of 1 cm, and the electrodes of the substrate were connected to a lead frame by gold lines, thereby manufacturing a solar cell element. The solar cell element having a size of 1 $cm^2$ connected to the lead frame was fixed to a sample stage, and probes contacted positive and negative electrodes of the lead frame, thereby forming a circuit for measuring current and voltage. Pseudo sunlight (Solar Simulator manufactured by YAMASHITA DENSO CORPORATION) with an energy density of 100 mW/$cm^2$ (1 SUN) and an AM1.5 spectrum was irradiated, and output characteristics were measured at the atmosphere temperature and the temperature of the solar cell below 25±1° C. The results were shown in Table 1.

TABLE 1

| Example No. | Junction structure | Open circuit voltage[V] | density [mA/$cm^2$] | efficiency |
|---|---|---|---|---|
| 1 | n-GaN/p-GaN | 2.7 | 1.2 | 2.4 |
| 2 | n-GaN/p-GaN | 2.6 | 1.1 | 2.0 |
| 3 | n-type $In_{x1}Ga_{1-x1}iN$ (X1 = 0.09)/ p-type $In_{x1}Ga_{1-x1}N$ (X1 = 0.09) | 2.0 | 1.8 | 2.5 |
| 4 | n-GaN/p-GaN | 2.8 | 1.3 | 2.6 |
| 5 | n-type $In_{x1}Ga_{1-x1}N$ (X1 = 0.07)/ p-type $In_{x1}Ga_{1-x1}N$ (X1 = 0.07) | 2.1 | 1.4 | 2.1 |

The use of the manufacturing method and the solar cell element according to the invention make it possible to increase the area of the solar cell substrate and to considerably reduce manufacturing costs. In addition, it is possible to provide a large solar cell for generating energy by combining the solar cell according to the invention with a concentrator.

In the present invention, the solar cell includes the buffer layer that is composed of a group-III nitride semiconductor and formed on the substrate, and the group-III nitride semiconductor layers (p-type layer/n-type layer) having a p-n junction therein. In the solar cell, at least one selected from the group consisting of the buffer layer and the group-III nitride semiconductor layer having the p-n junction therein has a compound semiconductor layer formed by a sputtering method. The use of the solar cell makes it possible to increase the area of the substrate and to considerably reduce manufacturing costs, as compared to the related art that manufactures a solar cell using only the MOCVD method.

Further, according to the manufacturing method according to the present invention, the sputtering method is easily combined with other methods (for example, a MOCVD method, an MBE method, a CBE method, and an MLE method), which makes it possible to increase the processing speed of a solar cell in each manufacturing process.

In the method of manufacturing a solar cell according to the present invention, the use of the sputtering method makes it possible to easily form a layer by supplying nitrogen in a plasma, radical, or atomic state and reacting nitrogen with a group-III element. In addition, the manufacturing method includes: a first step in which a process of supplying only dopant element and a process of simultaneously supplying a compound containing a group-III element and a nitrogen raw material are alternately repeated; and a second step of performing heat treatment on the layer formed by the first step. Therefore, it is possible to form a high-quality group-III nitride semiconductor layers (p-type layer/n-type layer).

Furthermore, in the solar cell according to the present invention in which the buffer layer that is formed on the substrate and is composed of a group-III nitride semiconductor or the underlying layer formed on the buffer layer has a compound semiconductor layer formed by the sputtering method, it is possible to reduce threading dislocation by optimizing the forming conditions of the buffer layer or the underlying layer. In particular, the buffer layer formed by the sputtering method has a thickness smaller than that of the buffer layer formed by the MOCVD method, but has in-plane uniformity higher than that of the buffer layer formed by the MOCVD method. Therefore, the buffer layer is single-crystallized from a polycrystalline material (for example, columnar crystal). For example, it is possible to obtain the underlying layer having the following characteristics: the rocking curve half-width of a (0002) plane is equal to or less than about 100 arcsec; and the rocking curve half-width of a (10-10) plane is equal to or less than about 300 arcsec. As a result, it is possible to improve the conversion efficiency of a solar cell having a p-n junction that is formed on the buffer layer.

While preferred embodiments of the invention have been described and illustrated above, it should be understood that these are exemplary of the present invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

The invention claimed is:

1. A method of manufacturing a solar cell, comprising:
   forming a buffer layer comprising a group-III nitride semiconductor on a substrate using a sputtering method;
   forming first and second group-III nitride semiconductor layers including a p-type layer and an n-type layer having a p-n junction therein and an electrode on the buffer layer, the forming of at least one of the first and second group-III nitride semiconductor layers is performed by a sputtering method comprising:
   a first step of alternately repeating a process of supplying only a dopant element and a process of simultaneously supplying a compound comprising a group-III element and a nitrogen raw material, and
   a second step of performing a heat treatment in a range of about 300° C. to about 1200° C. on at least one of the first and second group-III nitride semiconductor layers formed by the first step; and
   forming another electrode on the group-III nitride semiconductor layer including a p-type layer and an n-type layer having a p-n junction therein;
   wherein the sputtering method comprises reacting nitrogen in a plasma, radical, or atomic state with a group-III element, thereby forming the layer.

2. The method of manufacturing a solar cell according to claim 1,
   wherein the heat treatment is performed in an atmosphere that does not contain a gas of a compound comprising hydrogen atom or hydrogen gas.

3. The method of manufacturing a solar cell according to claim 1,
   wherein the dopant element is at least one selected from the group consisting of Si, Ge, and Sn.

4. The method of manufacturing a solar cell according to claim 1, wherein the dopant element is at least one of Mg and Zn.

* * * * *